(12) United States Patent
Hasegawa et al.

(10) Patent No.: US 6,848,974 B2
(45) Date of Patent: Feb. 1, 2005

(54) POLISHING PAD FOR SEMICONDUCTOR WAFER AND POLISHING PROCESS USING THEREOF

(75) Inventors: Kou Hasegawa, Mie (JP); Yukio Hosaka, Mie (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 10/252,696

(22) Filed: Sep. 24, 2002

(65) Prior Publication Data

US 2003/0060138 A1 Mar. 27, 2003

(30) Foreign Application Priority Data

Sep. 25, 2001 (JP) ........................ 2001-292159

(51) Int. Cl.$^7$ ................................ B24B 1/00
(52) U.S. Cl. .................. 451/41; 451/287; 451/288; 451/526; 451/528; 451/529; 451/533; 451/538; 451/539
(58) Field of Search ................ 451/41, 287, 288, 451/526, 528, 529, 533, 538, 539

(56) References Cited

U.S. PATENT DOCUMENTS

| | | | |
|---|---|---|---|
| 3,504,457 A | | 4/1970 | Jacobsen et al. |
| 6,354,915 B1 | * | 3/2002 | James et al. .............. 451/41 |
| 6,419,556 B1 | * | 7/2002 | Urbanavage et al. ....... 451/41 |
| 6,517,426 B2 | * | 2/2003 | Lee ........................ 451/537 |

FOREIGN PATENT DOCUMENTS

| | | | | |
|---|---|---|---|---|
| EP | 0 555 660 A2 | | 1/1993 | |
| EP | 1 046 466 A2 | | 10/2000 | |
| EP | 1046466 A2 | * | 10/2000 | ........... B24D/13/12 |
| EP | 1 252 973 A1 | | 10/2002 | |
| JP | 5-505769 | | 8/1993 | |
| JP | 6-21028 | | 1/1994 | |
| JP | 7 266219 | | 10/1995 | |
| JP | 2000-34416 | * | 2/2000 | ........ C08L/101/00 |
| WO | WO 91/14538 | | 10/1991 | |
| WO | WO 01/43920 A1 | | 6/2001 | |

OTHER PUBLICATIONS

U.S. Appl. No. 09/867,541, filed May 31, 2001, Ogawa, et al.
U.S. Appl. No. 09/983,097, filed Oct. 23, 2001, Hasegawa, et al.
U.S. Appl. No. 10/030,141, filed Jan. 28, 2002, Hasegawa, et al.
U.S. Appl. No. 10/128,282, filed Apr. 24, 2002, Hasegawa.
U.S. Appl. No. 10/252,696, filed Sep. 24, 2002, Hasegawa, et al.
U.S. Appl. No. 10/279,843, filed Oct. 25, 2002, Konnou, et al.
U.S. Appl. No. 09/995,613, filed Nov. 11, 2001, Hasegawa.

* cited by examiner

*Primary Examiner*—Joseph J. Hail, III
*Assistant Examiner*—Shantese McDonald
(74) *Attorney, Agent, or Firm*—Oblon, Spivak, McClelland, Maier & Neustadt, P.C.

(57) ABSTRACT

An object of the present invention is to provide a polishing pad for a semiconductor wafer which can perform a stable polishing while preventing a polishing layer from floating up from a supporting layer and a surface of a polishing pad from bending during polishing using a polishing pad having a multi-layered structure of a polishing layer and a supporting layer, and a polishing process using thereof. The polishing pad of the present invention is characterized in that it is comprising a supporting layer which is a non-porous elastic body and a polishing layer which is laminated on one surface of the supporting layer, and a polishing process using thereof. Shore D hardness of the polishing layer is preferably 35 or more, and hardness of the supporting layer is preferably lower than that of the polishing layer.

15 Claims, 1 Drawing Sheet

POLISHING PAD FOR SEMICONDUCTOR WAFER AND POLISHING PROCESS USING THEREOF

BACKGROUND OF THE INVENTION

1. Field of the Invention

The present invention relates to a polishing pad for a semiconductor wafer and polishing process using thereof. More particularly, the present invention relates to a polishing pad for a semiconductor wafer which can perform a stable polishing while preventing a polishing layer from floating up from a supporting layer and a surface of a polishing pad from bending during polishing using a polishing pad having a multi-layered structure of a polishing layer and a supporting layer, and polishing process using thereof.

2. Description of the Prior Art

Previously, a polishing pad for a semiconductor wafer having a multi-layered structure provided with a polishing layer, a supporting layer and the like has been known in polishing of a semiconductor wafer (JP-A H5-505769, JP-A H6-21028 and the like).

A polishing pad having a multi-layered structure is usually used as shown in FIG. 1. That is, a polishing pad 1 is applied to a surface plate 2 which rotates along an axis, while a semiconductor wafer 4 is attached to one end of a pressurizing head 3. The pressurizing head 3 can make the semiconductor wafer 4 slide on the surface of a polishing pad 1 by rotating and moving itself while pushing the semiconductor wafer 4 against the surface of the polishing pad 1.

At this time, a polishing pad situated under a pressurizing head is pushed to be compressed, and after a pressurizing head is moved, a polishing pad situated at that position is elastically recovered and a compression is released. In such a case, when a porous elastic body is used as the supporting layer, a slurry supplied from a slurry supplying part 5 and the like, or an aqueous medium in the slurry invades in a supporting layer 12 from a side and the like of the polishing pad 1 in some cases by repetition of compression and release. And, the air originally presented in the interior of the porous elastic body is gradually collected into a center part of an interface between the supporting layer 12 and the polishing layer 11, the supporting layer 12 and the polishing layer 11 are peeled, and the surface of the polishing pad 1 is bent in some cases. This phenomenon is not preferable in polishing a semiconductor wafer for the purpose of obtaining high flatness.

SUMMARY OF THE INVENTION

The present invention solves the above-mentioned problem, and an object of the present invention is to provide a polishing pad for a semiconductor wafer which can stably perform polishing without producing disadvantages such as floating of a polishing layer from a supporting layer and bending of the surface of the polishing pad during polishing, and a polishing process using thereof.

The present invention is described as follows.

A first object of the present invention is a polishing pad for a semiconductor wafer comprising a supporting layer which is a non-porous elastic body and a polishing layer which is laminated on one surface of said supporting layer.

A first aspect of the first object is that the hardness of said supporting layer is lower than that of said polishing layer.

A second aspect of the first object is that the Shore D hardness of said polishing layer is 35 or more.

A third aspect of the first object is where said polishing layer comprises a water-insoluble matrix material and a water-soluble particle dispersed in said matrix material.

A fourth aspect of the first object is a polishing pad for a semiconductor wafer comprising a supporting layer which is a non-porous elastic body and a polishing layer which is laminated on one surface of said supporting layer; wherein the hardness of said supporting layer is lower than that of said polishing layer; the Shore D hardness of said polishing layer is 35 or more; and the polishing layer comprises a water-insoluble matrix material and a water-soluble particle dispersed in said matrix material; wherein at least a part of said matrix material is a crosslinked polymer.

A fifth aspect of is one where a polishing pad for a semiconductor wafer comprising a supporting layer which is a non-porous elastic body and a polishing layer which is laminated on one surface of said supporting layer; wherein the hardness of said supporting layer is lower than that of said polishing layer; the Shore D hardness of said polishing layer is 35 or more; and the polishing layer comprises a water-insoluble matrix material and a water-soluble particle dispersed in said matrix material at least a part of said matrix material is a crosslinked polymer; wherein the average particle diameter of said water-soluble particle is 0.1 to 1,000 $\mu$m.

A sixth aspect is a polishing pad for a semiconductor wafer comprising a supporting layer which is a non-porous elastic body and a polishing layer which is laminated on one surface of said supporting layer; wherein the hardness of said supporting layer is lower than that of said polishing layer; the Shore D hardness of said polishing layer is 35 or more; and the polishing layer comprises a water-insoluble matrix material and a water-soluble particle dispersed in said matrix material at least a part of said matrix material is a crosslinked polymer; wherein the average particle diameter of said water-soluble particle is 0.1 to 1.000 $\mu$m; wherein said water-soluble particle is formed of at least one selected from the group consisting of dextrin, cyclodextrin, mannit, lactose, hydroxy propyl cellulose, methyl cellulose, starch, protein, polyvinyl alcohol, polyvinyl pyrrolidone, polyacrylic acid, polyethylene oxide, water-soluble photosensitive resin, sulfonated polyisoprene, sulfonated polyisoprene copolymer, potassium acetate, potassium nitrate, potassium carbonate, potassium bicarbonate, potassium chloride, potassium bromide, potassium phosphate, magnesium nitrate.

A seventh aspect is a polishing pad for a semiconductor wafer comprising a supporting layer which is a non-porous elastic body and a polishing layer which is laminated on one surface of said supporting layer; wherein the hardness of said supporting layer is lower than that of said polishing layer; the Shore D hardness of said polishing layer is 35 or more; and the polishing layer comprises a water-insoluble matrix material and a water-soluble particle dispersed in said matrix material; wherein at least a part of said matrix material is a crosslinked polymer; wherein content of said water-soluble particle is 1 to 70 vol % based on 100 vol % of total of said matrix material and said water-soluble particle.

An eighth aspect is a polishing pad far a semiconductor wafer comprising a supporting layer which is a non-porous elastic body and a polishing layer which is laminated on one surface of said supporting layer; wherein the hardness of said supporting layer is lower than that of said polishing layer; the Shore D hardness of said polishing layer is 35 or more; and the polishing layer comprises a water-insoluble matrix material and a water-soluble particle dispersed in said matrix material; wherein at least a part of said matrix material is a crosslinked polymer; wherein content of said water-soluble particle is 1 to 70 vol % based on 100 vol % of total of said matrix material and said water-soluble particle; wherein at least a part of said matrix material is a crosslinked polymer.

A ninth aspect is a polishing pad for a semiconductor wafer comprising a supporting layer which is a non-porous elastic body and a polishing layer which is laminated on one surface of said supporting layer; wherein the hardness of said supporting layer is lower than that of said polishing layer; the Shore D hardness of said polishing layer is 35 or more; and the polishing layer comprises a water-insoluble matrix material and a water-soluble particle dispersed in said matrix material; wherein at least a cart of said matrix material is a crosslinked polymer; wherein content of said water-soluble particle is 1 to 70 vol % based on 100 vol % of total of said matrix material and said water-soluble particle; wherein at least a part of said matrix material is a crosslinked polymer; wherein at least a part of said crosslinked polymer is a cross linked 1,2-polybutadiene.

A second object of the present invention is a polishing process for semiconductor wafer using a polishing pad comprising a supporting layer which is a nonporous elastic body and a polishing layer which is laminated on one surface of said supporting layer.

A first aspect of the second object is that the hardness of said supporting layer is lower than that of said polishing layer.

A second aspect of the second object is that the Shore D hardness of said polishing layer is 35 or more.

A third aspect of the second object is that the polishing layer comprises a water-insoluble matrix material and a water-soluble particle dispersed in said matrix material.

A fourth aspect of the second object is a polishing process for semiconductor wafer using a polishing pad comprising a supporting layer which is a nonporous elastic body and a polishing layer which is laminated on one surface of said supporting layer; wherein the hardness of said supporting layer is lower than that of said polishing layer; wherein the Shore D hardness of said polishing layer is 35 or more; wherein the polishing layer comprises a water-insoluble matrix material and a water-soluble particle dispersed in said matrix material; wherein at least a part of said matrix material is a crosslinked polymer.

A fifth aspect of the second object is a polishing process for semiconductor wafer using a polishing pad comprising a supporting layer which is a nonporous elastic body and a polishing layer which is laminated on one surface of said supporting layer; wherein the hardness of said supporting layer is lower than that of said polishing layer; wherein the Shore D hardness of said polishing layer is 35 or more; wherein the polishing layer comprises a water-insoluble matrix material and a water-soluble particle dispersed in said matrix material; wherein at least a part of said matrix material is a crosslinked polymer; wherein average particle diameter of said water-soluble particle is 0.1 to 1,000 $\mu$m.

A sixth aspect of the second object is a polishing process for semiconductor wafer using a polishing pad comprising a supporting layer which is a nonporous elastic body and a polishing layer which is laminated on one surface of said supporting layer; wherein the hardness of said supporting layer is lower than that of said polishing layer; wherein the Shore D hardness of said polishing layer is 35 or more; wherein the polishing layer comprises a water-insoluble matrix material and a water-soluble particle dispersed in said matrix material; wherein at least a part of said matrix material is a crosslinked polymer; wherein average particle diameter of said water-soluble particle is 0.1 to 1.000 $\mu$m; wherein said water-soluble particle is formed of at least one selected from the group consisting of dextrin, cyclodextrin, mannit, lactose, hydroxy propyl cellulose, methyl cellulose, starch, protein, polyvinyl alcohol, polyvinyl pyrrolidone, polyacrylic acid, polyethylene oxide, water-soluble photosensitive resin, sulfonated polyisoprene, sulfonated polyisoprene copolymer, potassium acetate, potassium nitrate, potassium carbonate, potassium bicarbonate, potassium chloride, potassium bromide, potassium phosphate, magnesium nitrate.

A seventh aspect of the second object is that the polishing layer comprises a water-insoluble matrix material and a water-soluble particle dispersed in said matrix material; wherein the content of said water-soluble particle is 1 to 70 vol % based on 100 vol % of total of said matrix material and said water-soluble particle.

An eighth aspect of the second object is that the polishing layer comprises a water-insoluble matrix material and a water-soluble particle dispersed in said matrix material; wherein the content of said water-soluble particle is 1 to 70 vol % based on 100 vol % of total of said matrix material and said water-soluble particle; wherein at least a part of said matrix material is a crosslinked polymer.

Finally, a ninth aspect of the second object is that the polishing layer comprises a water-insoluble matrix material and a water-soluble particle dispersed in said matrix material; wherein the content of said water-soluble particle is 1 to 70 vol % based on 100 vol % of total of said matrix material and said water-soluble particle; wherein at least a part of said matrix material is a crosslinked polymer; wherein at least a part of said crosslinked polymer is a crosslinked 1,2-polybutadiene.

According to a polishing pad for a semiconductor wafer of the present invention, polishing can be stably performed without producing disadvantages such as peeling between a polishing layer and a supporting layer, bending of the surface of a supporting pad due to floating of a polishing layer from a supporting layer and the like during polishing.

DETAILED DESCRIPTION OF THE INVENTION

A polishing pad for a semiconductor wafer of the present invention (hereinafter, also simply referred to as "polishing pad") is characterized in that it is comprising a supporting layer and a polishing layer which is laminated on one surface of the supporting layer, wherein the supporting layer is a non-porous elastic body.

The "supporting layer" is usually situated on a back side opposite to the polishing surface of the polishing layer.

A material constituting the supporting layer is not particularly limited, but various materials can be used. As this material, an organic material is preferable from a viewpoint that molding into a prescribed shape and nature is easy particularly and the suitable elasticity can be imparted. As the organic material, a thermoplastic resin, a thermosetting resin, an elastomer, a rubber and the like may be used alone or in combination of two or more.

Example of the thermoplastic resin includes a polyolefin-based resin, a polystyrene-based resin, a polyacrylic-based resin such as (meth)acrylate-based resin, a vinyl ester resin except for an acrylic resin, a polyester-based resin, a polyamide-based resin, a fluorine resin, a polycarbonate resin, a polyacetal resin and the like. These may be used alone or in combination of two or more.

Example of the thermosetting resin includes a phenol resin, an epoxy resin, an unsaturated polyester resin, a polyurethane resin, a polyurethane-urea resin, an urea resin, a silicone resin and the like. These may be used alone or in combination of two or more.

Further, example of the elastomer includes a styrene-based elastomer such as styrene-butadiene-styrene block copolymer (SBS) and hydrogenated block copolymer thereof (SEBS), a thermoplastic elastomer such as a diene-based elastomer exemplified 1,2-polybutadiene, a polyolefin-based elastomer (TPO), a thermoplastic polyurethane-based elastomer (TPU), a thermoplastic polyester-based elastomer (TPEE), a polyamide-based elastomer (TPAE), a silicone resin-based elastomer and a fluorine resin-based elastomer. These may be used alone or in combination of two or more.

Example of the rubber includes a styrene-butadiene rubber, an isoprene rubber, an isobutylene-isoprene rubber, a butyl rubber, an acrylic rubber, an acrylonitrile-butadiene rubber, an ethylene-propylene rubber, an ethylene-propylene-diene rubber, a silicone rubber, a fluorine rubber and the like. These may be used alone or in combination of two or more.

These respective materials may be modified with at least one polar group selected from the group consisting of anhydride group, carboxyl group, hydroxyl group, epoxy group, amino group and the like. For example, when a supporting layer is consisting of two phases of a matrix material (material constituting a continuous phase) and a domain material (material constituting a dispersion phase) dispersed therein due to the low compatibility, the affinity between respective phases and the like can be improved by modification. In addition, whether the above-mentioned materials constituting a supporting layer are a crosslinked polymer or a non-crosslinked polymer is not particularly limited.

The supporting layer is a non-porous body and may be a non-foamed body. In addition, the supporting layer includes a supporting layer by which water absorption activity can not be obtained since only the surface is usually porous. A specific gravity of the supporting layer is not particularly limited, but the specific gravity of a supporting layer measured according to JIS K 7311 relative to a specific gravity of a compact body formed under the high pressure so that no void is contained in is preferably 80% or more, more preferably 90% or more, further preferably 95% or more. When this ratio is below 80%, there is a tendency that voids in which the liquid can be impregnated are formed, being not preferable.

Hardness of the supporting layer may be higher than or the same as that of the polishing layer, but it is preferable that the hardness of the supporting layer is lower as compared with that of the polishing layer. The hardness of the supporting layer is preferably 90% or less, more preferably 80% or less, particularly 70% or less relative to the hardness of the polishing layer. Further, the hardness of the supporting layer is preferably 70 or less, more preferably 60 or less, particularly 50 or less in Shore D hardness.

A planar shape of the supporting layer is not particularly limited, but it may be a circle shape, a polygon such as square. This planar shape may be the same as or different from that of the polishing layer. In addition, a thickness thereof is not particularly limited, but it may be 0.1 to 5 mm (more preferably 0.5 to 2 mm).

The "polishing layer" is usually the one whose surface has polishing ability by itself. And the polishing layer can retain a slurry on its surface and, further can have transiently abrasive, polishing wastages and the like in the slurry reside in fine holes (hereinafter, also referred to as "pore") or grooves formed before and during polishing.

A material constituting the polishing layer may be the same as or different from the one constituting the supporting layer. Various materials may be used as the material constituting the polishing layer, but an organic material is preferable from a viewpoint that molding into a prescribed shape and nature is easy particularly. The organic materials may be the one exemplified as the materials constituting the above-mentioned supporting layer. In addition, most of the polishing layer is preferably water-insoluble.

In the case the material constituting the polishing layer is an organic material, the material may be a crosslinked polymer or a non-crosslinked polymer. Preferred is that at least a part of the polishing layer is a crosslinked polymer and that the polishing layer has elastic recovering force. The polishing layer may be a construction where a material composed of a mixture of two or more components and at least a part of at least one kind of the component is a crosslinked polymer, a construction where a material composed of one component and at least a part of the component is a crosslinked polymer, and the like.

The above-mentioned crosslinked polymer includes polymers obtained by crosslinking a resin such as polyurethane resin, epoxy resin, polyacrylic resin, unsaturated polyester resin, vinyl ester resin except for polyacrylic resin, a diene-based elastomer such as 1,2-polybutadiene, a rubber such as butadiene rubber, isoprene rubber, acrylic rubber, acrylonitrile-butadiene rubber, styrene-butadiene rubber, ethylene-propylene rubber, silicone rubber, fluorine rubber and styrene-isoprene rubber, and polymers obtained by crosslinking polyethylene, polyvinylidenefluoride and the like. Besides, ionomer and the like may be used. In addition, crosslinking is performed by a crosslinking agent, or irradiation with an ultraviolet-ray or an electron beam.

By using a crosslinked polymer as the material constituting the polishing layer, the elastic recovering force is given to the polishing layer, a displacement due to a shear stress applied to a polishing surface during polishing can be suppressed small, and embedding of a pore due to plastic deformation by excess stretching of the polishing layer can be prevented both during polishing and during dressing. Excess fuzzing of the surface of the polishing layer can be also prevented. For this reason, the retention of a slurry is better during polishing, the recovery of the retention of the slurry by dressing is easy and, further, scratch can be prevented from occurring.

The polishing layer is preferably comprised of a water-insoluble matrix material and a domain material dispersed in the matrix material. The domain material is not particularly limited and may be a water-soluble particle and the like. It is preferable that at least a part of the water-insoluble matrix material is a crosslinked polymer and the crosslinked polymer may be used that exemplified above. The above-mentioned matrix material may be the one whose all is crosslinked polymer or the one whose a part is crosslinked polymer. In the latter case, it may be a mixture containing a crosslinked polymer, a non-crosslinked polymer and the like. And at least a part of the crosslinked polymer is preferably crosslinked 1,2-polybutadiene.

The water-soluble particle is a particle that at least a part can drop off the polishing layer in contact with an aqueous medium in a slurry. Thereby, a pore is formed on the surface of the polishing layer.

A material constituting the water-soluble particle is not particularly limited, but various materials can be used. For example, an organic-based water-soluble particle and an inorganic-based water-soluble particle can be used. The organic-based water-soluble particle includes particles formed of dextrin, cyclodextrin, mannit, sugars such as lactose, celluloses such as hydroxypropyl cellulose and methyl cellulose, starch, protein, polyvinyl alcohol, polyvinyl pyrrolidone, polyacrylic acid, polyethylene oxide, water-soluble photosensitive resin, sulfonated polyisoprene, sulfonated polyisoprene copolymer and the like. Further, the inorganic-based water-soluble particle includes particles formed of potassium acetate, potassium nitrate, potassium carbonate, potassium bicarbonate, potassium chloride, potassium bromide, potassium phosphate, magnesium nitrate and the like. The water-soluble particle may be formed of one material or two or more materials. And further, it may be a water-soluble particle formed of a prescribed material or a water-soluble particle constituting two or more particles formed of different materials.

It is preferable that only water-soluble particles exposed on the surface of the polishing layer are dissolved in water, and the water-soluble particle existing in the interior of the polishing layer without emerging on the surface do not absorb a moisture and are not swollen. For this reason, an outer shell composed of epoxy resin, polyimide, polyamide, polysilicate and the like for inhibiting moisture absorption may be formed on at least a part of an outermost part of the water-soluble particle.

By the way, Shore D hardness of whole of the polishing layer is preferably 35 or more, more preferably 35 to 100, most preferably 45 to 90 for the purpose of increasing the pressure applied during polishing, improving a removal rate, and obtaining high flatness. But a polishing layer comprising no domain materials such as water-soluble particle and constituted with only matrix material may not show enough Shore D hardness.

This water-soluble particle has, in addition to the function of forming a pore during polishing, the function of increasing an indentation hardness of the polishing layer suitable. Therefore, comprising a water-soluble particle leads to improvement of Shore D hardness in addition to forming a pore. It is preferable that the water-soluble particle is a solid particle which can retain a sufficient indentation hardness in a polishing pad.

Size of the water-soluble particle is not particularly limited, but average particle diameter measured according to JIS K 6221 is preferably 0.1 to 1,000 μm, more preferably 0.1 to 500 μm, most preferably 0.5 to 200 μm. When the average particle diameter is less than 0.1 μm, a size of a pore may be smaller than that of an abrasive, and the abrasive may not be sufficiently retained in a pore, being not preferable. On the other hand, when the size exceeds 1,000 μm, a size of a formed pore may become too large, and there is a tendency that a mechanical strength of the polishing layer and a removal rate are reduced.

Further, content of a water-soluble particle in the polishing layer is not particularly limited and is usually 1 to 70 vol %, more preferably 1 to 50 vol %, most preferably 1 to 40 vol % based on 100 vol % of the total of a water-insoluble matrix material and the water-soluble particle. In the case the polishing layer is constituted with the water-insoluble matrix material in which a pore is not formed by a method such as pre-foaming, if the content of the water-soluble particle is less than 1 vol %, a sufficient amount of pore is not formed, and there is a tendency that a removal rate is reduced. On the other hand, when the content exceeds 70 vol %, there is a tendency that it becomes difficult to prevent a water-soluble particle present in the interior from unintentionally dissolving or swelling.

And the polishing layer may contain, in addition to the matrix material and the domain material such as a water-soluble particle, a compatiblizing agent (a polymer modified with a polar group such as anhydride group, carboxyl group, hydroxyl group, epoxy group, oxazoline group, amino group, a block copolymer, a random copolymer and the like) in order to improve the affinity and the dispersibility between the matrix material and the domain material, various nonionic surfactants, a coupling agent and the residue thereof as option.

The polishing layer may contain at least one selected from the group consisting of an abrasive formed of such as silica, alumina, ceria, zirconia and titania, an oxidizing agent, a hydroxide of an alkali metal, an acid, a pH adjusting agent, a surfactant and a scratch inhibitor conventionally contained in a slurry. And the polishing layer may further contain various additives such as a filler, a softening agent, an antioxidant, an ultraviolet absorbing agent, an antistatic agent, a lubricant, a plasticizer and the like. In particular, as the filler, materials which improve the rigidity such as calcium carbonate, magnesium carbonate, talc and clay can be used.

The oxidizing agent includes hydrogen peroxide, an organic peroxide such as peracetic acid, perbenzoic acid and tert-butylhydroperoxide, permanganate compounds such as potassium permanganate, bichromate compounds such as potassium bichromate, halogenate compounds such as potassium iodate, nitric compounds such as nitric acid and iron nitrate, perhalogenate compounds such as perchloric acid, transition metal salts such as potassium ferricyanide, persulfuric compounds such as ammonium persulfate and heteropoly acids. Particularly preferred among these oxidizing agents are hydrogen peroxide and organic peroxides which contain no metals and whose decomposition products are harmless. The oxidizing agents may be used alone or in combination of two or more.

The alkali metal hydroxide includes sodium hydroxide, potassium hydroxide, rubidium hydroxide, cesium hydroxide and the like. These alkali metal hydroxides may be used alone or in combination of two or more.

And the acid is not particularly limited, and any organic acid or inorganic acid may be used. The organic acid includes para-toluenesulfonic acid, dodecylbenzenesulfonic acid, isoprenesulfonic acid, gluconic acid, lactic acid, citric acid, tartaric acid, malic acid, glycolic acid, malonic acid, formic acid, oxalic acid, succinic acid, fumaric acid, maleic acid and phthalic acid. These organic acids may be used alone or in combinations of two or more. The inorganic acid includes nitric acid, hydrochloric acid and sulfuric acid, and any one or more of these may be used. An organic acid and an inorganic acid may also be used in combination.

The surfactant includes a cationic surfactant, an anionic surfactant and a non-ionic surfactant. As a cationic surfactant there may be mentioned fatty amines, aliphatic ammonium salts and the like. As an anionic surfactant there may be mentioned carboxylic acid salts such as fatty acid soaps and alkylether carboxylic acid salts, sulfonic acid salts such as alkylbenzenesulfonic acid salts, alkylnaphthalenesulfonic acid salts and α-olefinsulfonic acid salts, sulfuric acid ester salts such as higher alcohol sulfuric acid ester salts and alkylether sulfuric acid salts, and phosphoric acid esters such as alkylphosphoric acid esters and the like. These surfactants may be used alone or in combination of two or more.

The scratch inhibitor includes biphenol, bipyridyl, 2-vinylpyridine, 4-vinylpyridine, salicylaldoxime, o-phenylenediamine, m-phenylenediamine, catechol, o-aminophenol, thiourea, N-alkyl-group-containing (meth) acrylamide, N-aminoalkyl-group-containing (meth) acrylamide, 7-hydroxy-5-methyl-1,3,4-triazaindolizine, 5-methyl-1H-benzotriazole, phthalazine, melamine, 3-amino-5,6-dimethyl-1,2,4-triazine and the like. These scratch inhibitors may be used alone or in combination of two or more.

The polishing layer can render the residual elongation after breaking (hereinafter, simply referred to as "break residual elongation") 100% or less when a test piece formed by the material constituting the polishing layer is broken at 80° C. according to JIS K 6251. That is, a polishing layer can be obtained in which a total distance between gazes in a test piece after breaking is 2 or less-fold a distance between gazes before breaking. The break residual elongation is preferably 30% or less, more preferably 10% or less, most preferably 5% or less. Lower limit of the break residual elongation is 0%. As the break residual elongation is exceeding 100%, fine fragments scratched or elongated from the surface of the polishing layer during polishing and surface updating tend to easily clog pores.

A break residual elongation is an elongation obtained by subtracting a distance between marks before test from the total of the two distance between respective marks and broken parts of broken and divided test pieces, when a test piece is broken in a tensile test at a test piece shape of dumbbell No. 3, a tensile rate of 500 mm/min. and a test temperature of 80° C. according to JIS K 6251 "Tensile test method on a vulcanized rubber". Regarding a test temperature, since a temperature obtained by gliding in actual polishing is around 80° C., the test was performed at this temperature.

A method of dispersing a water-soluble particle in a polishing layer is not particularly limited. The above-mentioned organic material which is to be a water-insoluble matrix material, a water-soluble particle and other additives are usually kneaded to obtain a molding of a polishing layer. In this kneading, a water-insoluble matrix material is kneaded by heating so as to be easily processed, and it is preferable that a water-soluble particle is a solid at a temperature at this time. By being a solid, it becomes easy to disperse a water-soluble particle in the state where the above-mentioned preferable average particle diameter is exhibited, irrespective of the compatibility with the water-insoluble matrix material. Therefore, it is preferable that a kind of a water-soluble particle is selected depending on a processing temperature for an organic material to be used.

Planar shape of the polishing layer is not particularly limited, but may be a circle or a polygon such as square. In addition, its thickness is also not particularly limited, but is preferably 0.1 to 20 mm, further preferably 0.5 to 10 mm, particularly 0.5 to 5 mm.

On surface of the polishing layer, a pore and/or a groove for retaining a slurry or having a slurry, a polishing wastage and the like in the slurry reside, may be pre-formed (for example, foamed body and the like), or may be formed by dropping off a domain material such as a water-soluble particle contained and dispersed in the matrix material (including a water-soluble particle described later) dispersed and contained in a matrix material from the surface of the polishing layer during polishing. The above-mentioned groove may be provided for the purpose of improving the discharging property of the spent slurry.

The polishing pad of the invention is the one laminated a supporting layer and a polishing layer. A method of laminating a supporting layer and a polishing layer is not particularly limited. In addition, this lamination may be performed by connection or without connection. For example, when the surface of the supporting layer and the surface of the polishing layer have a sufficient friction to an extent that they are not slid from each other during polishing, lamination can be performed without connection. Alternatively, lamination can be performed by connection using an adhesive or an adhering material (double-coated tape and the like). Further, a convex part and a concave part fittable to convex part are respectively equipped on both of the supporting layer and the polishing layer to connection.

A shape of a polishing pad of the present invention is not particularly limited, but various shapes can be used. For example, the shape can be appropriately selected from the disc, the belt, the roller shapes and the like. Further, a polishing pad of the present invention may be provided with one or two or more other layers (for example, a substrate layer made of a metal to be provided on a side opposite to a polishing side of a supporting layer) in addition to the above-mentioned supporting layer and the above-mentioned polishing layer.

A polishing pad of the present invention is attached to a known polishing apparatus, and it can be effectively polished a semiconductor wafer consisted of a metal, an alloy, an inorganic compound such as a metal oxide, and the like.

As used herein, "slurry" means an aqueous dispersion containing at least an abrasive. What supplied from outside during polishing may be a slurry or only an aqueous medium containing no abrasive or the like. In the case of supplying an aqueous medium, containing an abrasive in the polishing pad leads to a slurry by mixing of the abrasive and the aqueous medium during polishing.

DESCRIPTION OF THE PREFERRED EMBODIMENTS

Figure 1:
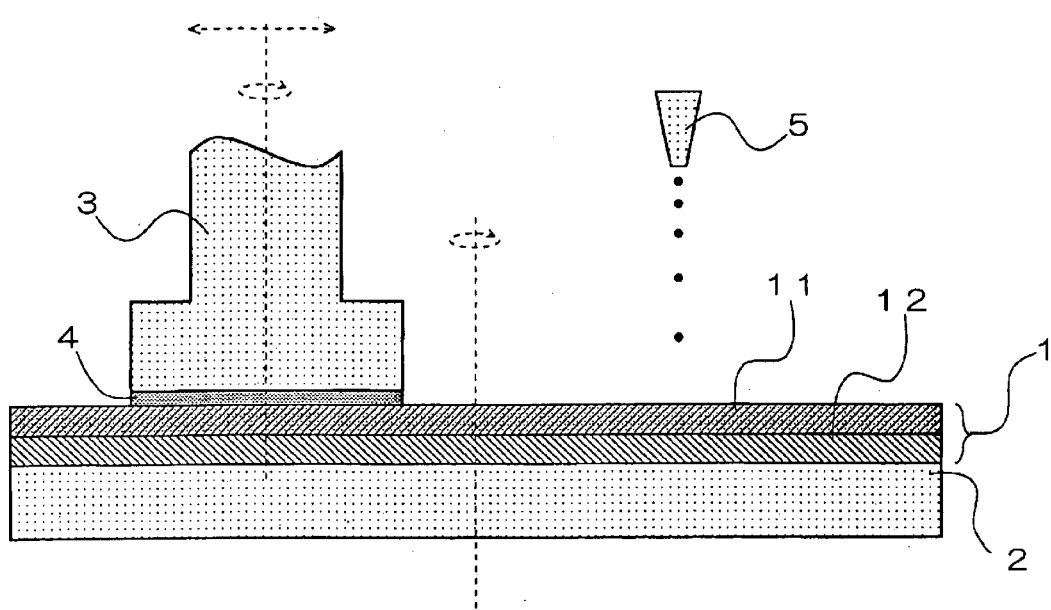
FIG. 1 is a schematic view of one example of a method for using a polishing pad.
Figure 2:
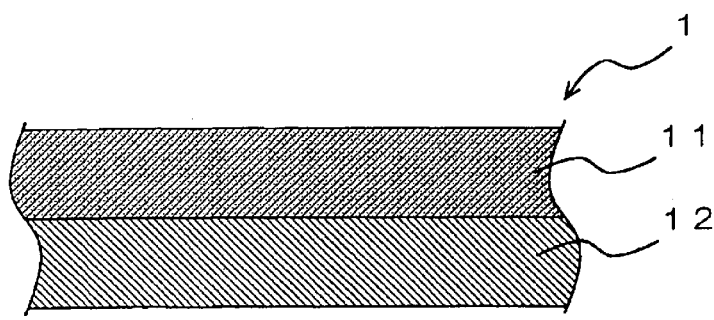
FIG. 2 is a cross-sectional view of a polishing pad.

The present invention will be specifically explained by way of Examples below.

[1] Production of a Polishing Pad Having a Supporting Layer Composed of a Non-porous Elastic Body (1) Production of a Polishing Layer 80 vol % of 1,2-polybutadiene (manufactured by JSR Corp, Ltd., trade name; "JSR RB830") which will be crosslinked later to become a water-insoluble matrix material and 20 vol % of β-cyclodextrin (manufactured by Yokohamakokusai Biokenkyujo K. K., trade name "Dexypearl β-100") as a water-soluble particle were kneaded at a kneader heated at 120° C. Thereafter, dicumyl peroxide (manufactured by NOF Corp., trade name; "Percumyl D40") was added at 0.6 part by weight based on 100 parts by weight of the total of 1,2-polybutadiene and β-cyclodextrin, which was kneaded, crosslinking-reacted at 170° C. for 18 minutes in a mold, and the reacted material was molded to obtain a disc-like polishing layer having a diameter of 600 mm and a thickness of 3 mm.

(2) Production of a Supporting Layer

On the other hand, by using 100 vol % of 1,2-polybutadiene (manufactured by JSR Corp., trade name; "JSR RB830") without a crosslinking agent, molding was performed at 130° C. in a mold to obtain a disc-like supporting layer (non-crosslinked body) having a diameter of 600 mm and a thickness of 2 mm.

(3) Lamination

A polishing layer obtained in (1) above and a supporting layer obtained in (2) above were laminated by connection with a double-coated adhesive tape (manufactured by Sumitomo 3M Co., Ltd., trade mane; "ST-416P") to obtain a polishing pad.

[2] Preparation of a Polishing Pad Having a Supporting Layer Composed of a Porous Elastic Body As a polishing layer, the polishing layer obtained in (1) of [1] above was used. On the other hand, as a supporting layer, expanded polyurethane foam having a thickness of 2 mm (manufactured by Lintec Corp., trade name; "TL-55-2") with both surfaces coated with a pressure-sensitive adhesive was cut into a diameter of 600 mm, was used.

The polishing layer obtained in (1) of [1] above and a supporting layer obtained in [2] above were laminated by connection to obtain a polishing pad to be used in Comparative Example.

[3] Evaluation of Polishing

The polishing pad obtained in [1] above and a polishing pad obtained in [2] above were applied on a surface plate of a polishing device (manufactured by Lapmaster STF Corp., model "LGP510"), respectively, with a double-coated adhesive tape (manufactured by Sumitomo 3M Co., Ltd., trade name; "ST-416P"), and a blanket wafer with a thermally oxidized membrane thereon was polished while supplying a slurry (manufactured by JSR Corp., trade name; "CMS1101") at 100 ml/min. Polishings were performed at a table rotating number of 50 rpm and a polishing pressure of 350 g/cm$^2$.

In polishing using a polishing pad for comparative example obtained in [2] above, an invasion of the slurry into an around 20 mm region was perceived in a direction from an outer edge to a center of the supporting layer during polishing (20 minutes after initiation of polishing). When polishing was further continued as it was for about 2 hours, an outer periphery of the supporting layer was peeled from the surface plate. To the contrary, in polishing using a polishing pad of the present invention obtained in [1] above, no phenomenon was perceived that slurry invaded into the supporting layer during polishing. Therefore, peeling of the supporting layer from the surface plate, floating up of the polishing layer from the supporting layer, bending of the surface of the polishing pad and the like were not perceived.

What is claimed is:

1. A polishing pad for semiconductor wafer comprising a supporting layer which is a non-porous elastic body and a polishing layer which is laminated on one surface of said supporting layer,
    wherein said polishing layer comprises a water-insoluble matrix material and a water-soluble particle dispersed in said matrix material and
    said water-soluble particle is formed of at least one compound selected from the group consisting of dextrin, cyclodextrin, mannit, lactose, hydroxy propyl cellulose, methyl cellulose, protein, sulfonated polyisoprene, sulfonated polyisoprene copolymer, potassium acetate, potassium nitrate, potassium carbonate, potassium bicarbonate, potassium chloride, potassium bromide, potassium phosphate and magnesium nitrate.

2. A polishing pad for semiconductor wafer according to claim 1, wherein the hardness of said supporting layer is 90% or less as compared with that of said polishing layer.

3. A polishing pad for semiconductor wafer according to claim 1, wherein the Shore D hardness of said polishing layer is 35 or more.

4. A polishing pad for semiconductor wafer according to claim 1, wherein at least a part of said matrix material is a crosslinked polymer.

5. A polishing pad for semiconductor wafer according to claim 4, wherein at least a part of said crosslinked polymer is a crosslinked 1,2-polybutadiene.

6. A polishing pad for semiconductor wafer according to claim 4, wherein said supporting layer is formed of at least one compound selected from the group consisting of a styrene-based elastomer, a diene-based elastomer, a polyolefin-based elastomer, a thermoplastic polyurethane-based elastomer, a thermoplastic polyester-based elastomer, and a polyamide-based elastomer.

7. A polishing pad for semiconductor wafer according to claim 1, wherein the content of said water-soluble particle is 1 to 70 vol % based on 100 vol % of total of said matrix material and said water-soluble particle.

8. A polishing pad for semiconductor wafer comprising a supporting layer which is a non-porous elastic body and a polishing layer which is laminated on one surface of said supporting layer,
    wherein said polishing layer comprises a water-insoluble matrix material and a water-soluble particle dispersed in said matrix material and the average particle diameter of said water-soluble particle is 0.5 to 200 $\mu$m; and
    wherein said water-soluble particle is formed of at least one compound selected from the group consisting of dextrin, cyclodextrin, mannit, lactose, hydroxy propyl cellulose, methyl cellulose, protein, sulfonated polyisoprene, sulfonated polyisoprene copolymer, potassium acetate, potassium nitrate, potassium carbonate, potassium bicarbonate, potassium chloride, potassium bromide, potassium phosphate, and magnesium nitrate.

9. A polishing pad for semiconductor wafer according to claim 8, wherein at least a part of said matrix material is a crosslinked polymer.

10. A polishing pad for semiconductor wafer according to claim 9, wherein at least a part of said matrix material is a crosslinked 1,2-polybutadiene.

11. A polishing pad for semiconductor wafer according to claim 8, wherein said supporting layer is formed of at least one compound selected from the group consisting of a styrene-based elastomer, a diene-based elastomer, a polyolefin-based elastomer, a thermoplastic polyurethane-based elastomer, a thermoplastic polyester-based elastomer, and a polyamide-based elastomer.

12. A polishing process for semiconductor wafer using a polishing pad comprising a supporting layer which is a non-porous elastic body and a polishing layer which is laminated on one surface of said supporting layer,
    wherein said polishing layer comprises a water-insoluble matrix material and a water-soluble particle dispersed in said matrix material and the average particle diameter of said water-soluble particle is 0.5 to 200 $\mu$m; and
    wherein said water-soluble particle is formed of at least one compound selected from the group consisting of dextrin, cyclodextrin, mannit, lactose, hydroxy propyl cellulose, methyl cellulose, protein, sulfonated polyisoprene, sulfonated polyisoprene copolymer, potassium acetate, potassium nitrate, potassium carbonate, potassium bicarbonate, potassium chloride, potassium bromide, potassium phosphate, and magnesium nitrate.

13. A polishing process for semiconductor wafer according to claim 12, wherein at least a part of said matrix material is a crosslinked polymer.

14. A polishing process for semiconductor wafer according to claim 13, wherein at least a part of said matrix material is a crosslinked polymer.

15. The polishing process for semiconductor wafer according to claim 12, wherein said supporting layer is formed of at least one compound selected from the group consisting of a styrene-based elastomer, a diene-based elastomer, a polyolefin-based elastomer, a thermoplastic polyurethane-based elastomer, a thermoplastic polyester-based elastomer, and a polyamide-based elastomer.

* * * * *